(12) United States Patent
Shih

(10) Patent No.: US 9,537,073 B2
(45) Date of Patent: Jan. 3, 2017

(54) METHOD FOR FABRICATING A LIGHT EMITTING DIODE (LED) DIE HAVING STRAP LAYER

(71) Applicant: SemiLEDS Optoelectronics Co., Ltd., Chu-Nan (TW)

(72) Inventor: Yi-Feng Shih, Chu-Nan (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 15/098,558

(22) Filed: Apr. 14, 2016

(65) Prior Publication Data

US 2016/0225968 A1 Aug. 4, 2016

Related U.S. Application Data

(62) Division of application No. 14/341,815, filed on Jul. 27, 2014.

(51) Int. Cl.
| | |
|---|---|
| *H01L 21/00* | (2006.01) |
| *H01L 33/62* | (2010.01) |
| *H01L 33/06* | (2010.01) |
| *H01L 33/60* | (2010.01) |
| *H01L 33/38* | (2010.01) |
| *H01L 33/00* | (2010.01) |

(Continued)

(52) U.S. Cl.
CPC ............. *H01L 33/62* (2013.01); *H01L 33/005* (2013.01); *H01L 33/007* (2013.01); *H01L 33/0095* (2013.01); *H01L 33/06* (2013.01); *H01L 33/10* (2013.01); *H01L 33/24* (2013.01); *H01L 33/32* (2013.01); *H01L 33/38* (2013.01); *H01L 33/382* (2013.01); *H01L 33/44* (2013.01); *H01L 33/60* (2013.01); *H01L 2933/0016* (2013.01); *H01L 2933/0033* (2013.01); *H01L 2933/0058* (2013.01); *H01L 2933/0066* (2013.01)

(58) Field of Classification Search
CPC ............. H01L 27/10867; H01L 29/945; H01L 29/66181; H01L 21/84; H01L 27/10829; H01L 27/1203; H01L 27/1087; H01L 2924/0002; H01L 27/10861; H01L 2924/00; H01L 27/0207; H01L 27/10826; H01L 27/10873
See application file for complete search history.

(56) References Cited

U.S. PATENT DOCUMENTS 9,419,195 B2    8/2016   Shih
9,437,794 B2    9/2016   Shih
(Continued)

OTHER PUBLICATIONS

U.S. Appl. No. 14/341,815, Office Action dated Jan. 20, 2016, pp. 1-12.

*Primary Examiner* — Robert Bachner
(74) *Attorney, Agent, or Firm* — Stephen A. Gratton

(57) ABSTRACT

A method for fabricating a light emitting diode (LED) die includes the steps of forming an epitaxial stack on a substrate having an n-type semiconductor layer, multiple quantum well (MQW) layers, and a p-type semiconductor layer. The method also includes the steps of forming a plurality of trenches in the n-type semiconductor layer, and forming a strap layer having conductive straps and contact areas in the trenches, forming an electrical insulator layer on the strap layer, forming an n-pad on the n-type semiconductor layer, and forming a p-pad on the p-type semiconductor layer.

11 Claims, 15 Drawing Sheets

(51) Int. Cl.
*H01L 33/44* (2010.01)
*H01L 33/10* (2010.01)
*H01L 33/32* (2010.01)
*H01L 33/24* (2010.01)

(56) References Cited

U.S. PATENT DOCUMENTS

2004/0036051 A1* 2/2004 Sneh ................ H01L 27/10861
 251/301
2011/0210357 A1* 9/2011 Kaiser ................ H01L 33/0079
 257/98
2016/0027978 A1 1/2016 Shih

* cited by examiner

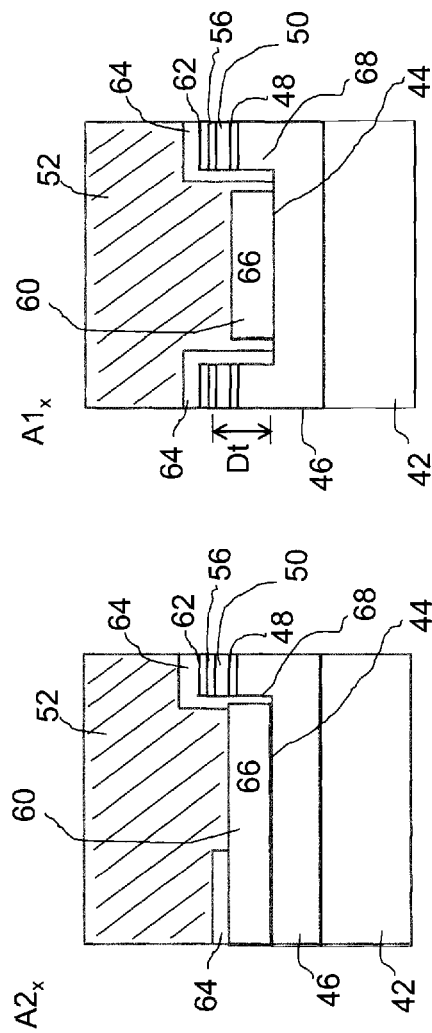
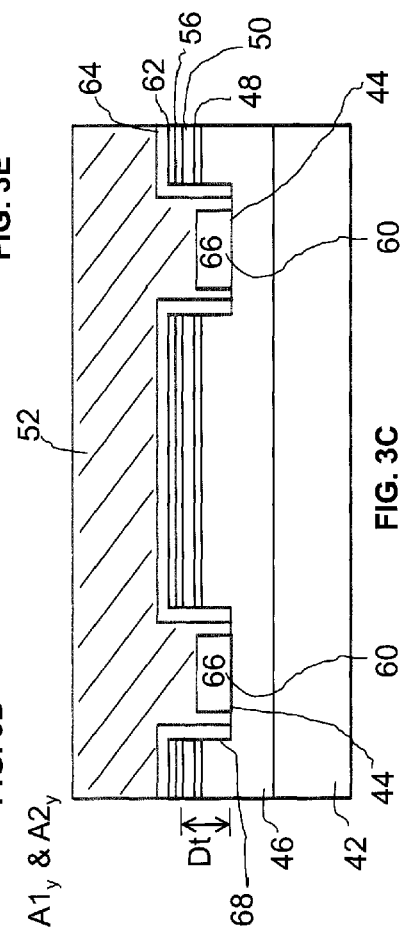
FIG. 3E
FIG. 3D
FIG. 3C

US 9,537,073 B2

METHOD FOR FABRICATING A LIGHT EMITTING DIODE (LED) DIE HAVING STRAP LAYER

CROSS REFERENCE TO RELATED APPLICATIONS

This application is a division of Ser. No. 14/341,815 filed Jul. 27, 2014 U.S. Pat. No. 9,419,195 B2.

FIELD

This application relates generally to light emitting diode (LED) dice and particularly to a light emitting diode (LED) die having a strap layer and to a method for fabricating the light emitting diode (LED) die.

BACKGROUND

A prior art light emitting diode (LED) die 10 in the form of a vertical light emitting diode (VLED) die is shown in FIGS. 1A-1C. As shown in FIG. 1A, the light emitting diode (LED) die 10 includes a substrate 12, and an epitaxial stack 14 on the substrate 12. The epitaxial stack 14 includes an n-type semiconductor layer 16, a multiple quantum well (MQW) layer 18 in electrical contact with the n-type semiconductor layer 16 configured to emit electromagnetic radiation, and a p-type semiconductor layer 20 in electrical contact with the multiple quantum well (MQW) layer 18; the n-type semiconductor layer 16 could have multilayers of various n-type doping including lightly doped layer (sometime is called undoped layer) or buffered layer and may also have super lattice layer/layers; the p-type semiconductor layer 16 could have multilayers of various p-type doping level and electron blocking layer (EBL); it is well known that the MQW layer 18 is comprised of many pairs of well and barrier layers. The light emitting diode (LED) die 10 also includes a mirror layer 22, a p-contact layer 24 in electrical contact with the p-type semiconductor layer 20, and a p-pad 28 in electrical contact with the p-contact layer 24.

The light emitting diode (LED) die 10 also includes an n-pad 30 comprised of multiple conductive n-trenches in electrical contact with n-conduct areas 27 on the n-type semiconductor layer 16. The light emitting diode (LED) die 10 also includes an electrical insulator layer 26 configured to electrically isolate the p-pad 28 and the n-pad 30. As shown in FIG. 2, during a packaging process, the light emitting diode (LED) die 10 can be flip chip mounted to a module substrate 32 with the p-pad 28 bonded to a p-electrode 34 on the module substrate 32, and with the n-pad 30 bonded to an n-electrode 36 on the module substrate 32.

One characteristic of the light emitting diode (LED) die 10 is that the p-pad 28 and the n-pad 30 are separated by a gap $W_{GAP}$. The size of the gap $W_{GAP}$ affects the output radiation of the light emitting diode (LED) die 10, particularly along the outside edge of the p-pad 28. For example, if the gap $W_{GAP}$ is relatively large, then the distance between the p-pad 28 and the n-pad 30 would also be large, and the output radiation along the outside edge of the p-pad 28 would be low. The width $W_{P-PAD}$ of the p-pad 28 is also dependent on the size of the gap $W_{GAP}$, such that a smaller p-pad width $W_{P-PAD}$ also produces a lower output radiation. The size of the gap $W_{GAP}$, along with the p-pad width $W_{P-PAD}$ and the n-pad width $W_{N-PAD}$, are set by the fabrication process, such that additional masks and additional process steps, are required to vary the dimensions of these features.

It would be desirable for the gap $W_{GAP}$ to be adjustable to permit optimization of the radiation output of the light emitting diode (LED) die 10, particularly along the outside edge of the p-pad 28. In addition, an adjustable size for the gap $W_{GAP}$ would allow the p-pad width $W_{P-PAD}$, and the n-pad width $W_{N-PAD}$ to be optimized. Further, an adjustable gap $W_{GAP}$ would facilitate the packaging process by permitting flexibility in the alignment of the p-pad 28 and the n-pad 30 to the electrodes 34, 36 on the module substrate 32. The present disclosure is directed to a light emitting diode (LED) die having n-straps that permit the size of the gap $W_{GAP}$, as well as the p-pad width of the width $W_{P-PAD}$ and the n-pad width $W_{N-PAD}$ to be adjusted to provide optimal radiation output, and a large process window for packaging.

However, the foregoing examples of the related art and limitations related therewith are intended to be illustrative and not exclusive. Other limitations of the related art will become apparent to those of skill in the art upon a reading of the specification and a study of the drawings. Similarly, the following embodiments and aspects thereof are described and illustrated in conjunction with a light emitting diode (LED) die which are meant to be exemplary and illustrative, not limiting in scope.

SUMMARY

A light emitting diode (LED) die includes a substrate and an epitaxial stack on the substrate. The epitaxial stack includes a first-type semiconductor layer, a multiple quantum well (MQW) layer in electrical contact with the first-type semiconductor layer configured to emit electromagnetic radiation, and a second-type semiconductor layer in electrical contact with the multiple quantum well (MQW) layer. The light emitting diode (LED) die also includes a first pad in electrical contact with the first-type semiconductor layer, and a second pad in electrical contact with the second-type semiconductor layer. The light emitting diode (LED) die also includes a strap layer having conductive straps and contact areas formed in trenches in the second-type semiconductor layer. The strap layer spreads current over the contact areas, and permits a gap width between the first pad and the second pad, as well as the widths of the first pad and the second pad to be adjusted.

A method for fabricating the light emitting diode (LED) die includes the steps of forming an epitaxial stack on a substrate having a first-type semiconductor layer, multiple quantum well (MQW) layers, and a second-type semiconductor layer. The method also includes the steps of forming a plurality of trenches in the second-type semiconductor layer, and forming a strap layer having conductive straps and contact areas in the trenches, forming an electrical insulator layer on the strap layer, forming a first pad on the first-type semiconductor layer, and forming second pad on the second-type semiconductor layer.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIGS. 3B-2 and 3B-3 are a schematic transverse sectional view along an inner section that is planar to a surface of an n-conduct area of the flip chip light emitting diode (LED) die which has non rectangular strap design in these examples they are elongated and trapezoid to further enhance current spreading.

FIG. 3C is a schematic cross sectional view taken along section line A1y and A2y in FIGS. 3A and 3B-1, 3B-2, 3B-3 illustrating a y-direction cross section of the flip chip light emitting diode (LED) die;

FIG. 3D is a schematic cross sectional view taken along section line A2x in FIGS. 3A and 3B-1, 3B-2, 3B-3 illustrating an x-direction cross section of the flip chip light emitting diode (LED) die;

FIG. 3E is a schematic cross sectional view taken along section line A1x in FIGS. 3A and 3B-1, 3B-2, 3B-3 illustrating an x-direction cross section of the flip chip light emitting diode (LED) die;

DETAILED DESCRIPTION OF THE PREFERRED EMBODIMENTS

Figure 1A:
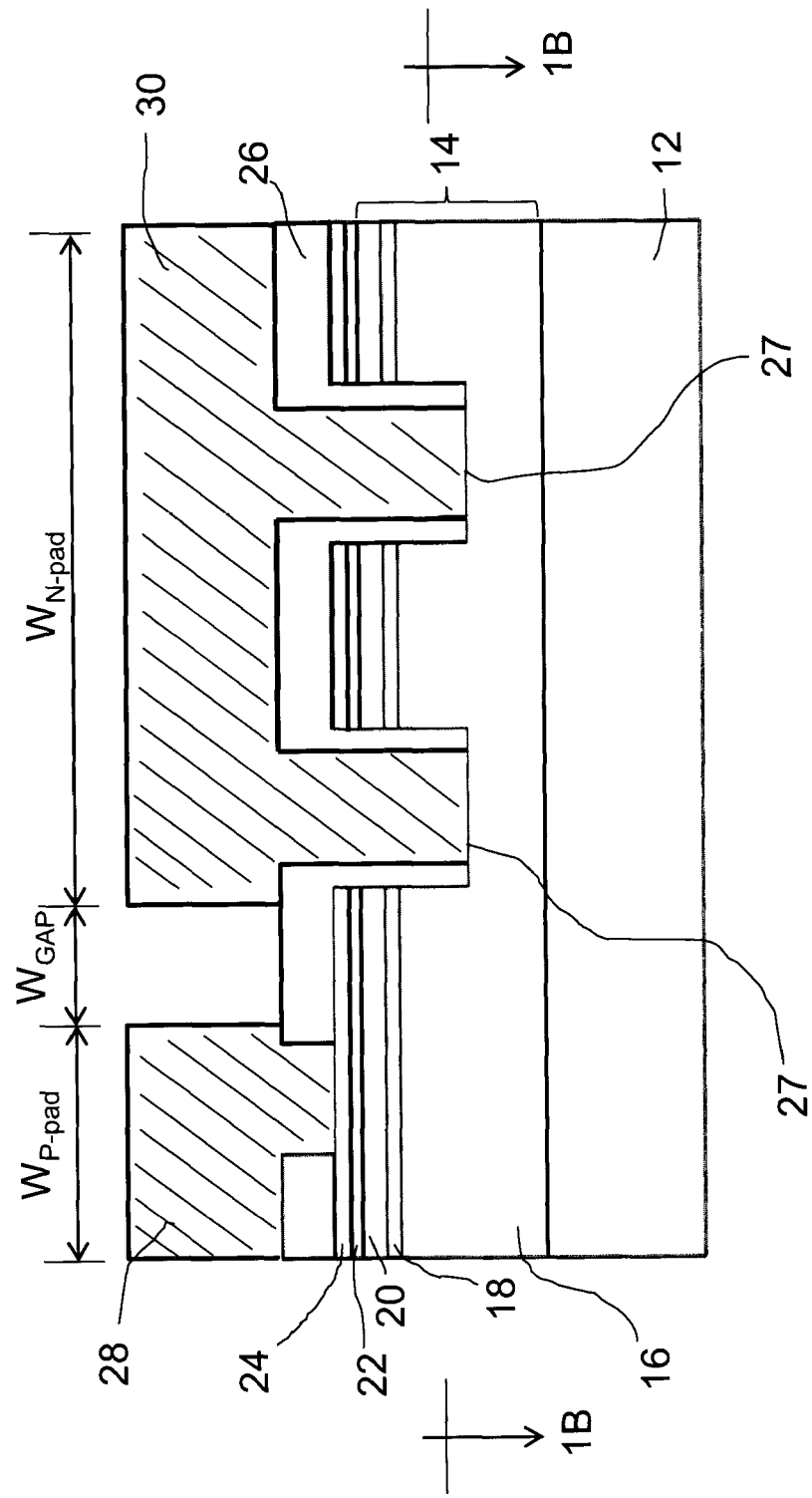
FIG. 1A is a schematic cross sectional view of a prior art light emitting diode (LED) die taken along section line 1A-1A of FIGS. 1B and 1C.
Figure 1C:
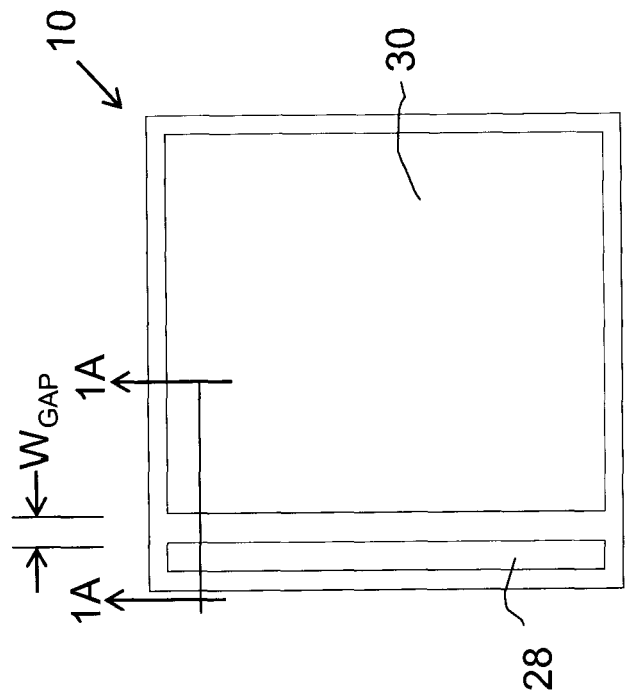
FIG. 1C is a schematic plan view of the prior art light emitting diode (LED) die.
Figure 1B:
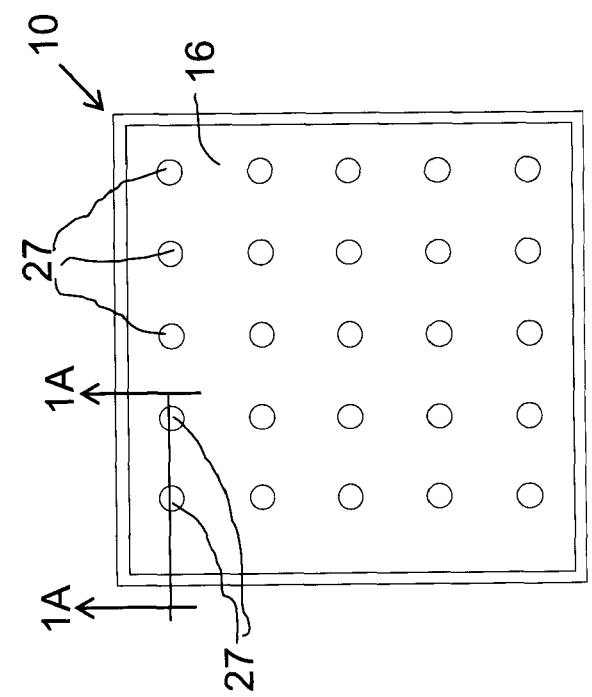
FIG. 1B is a schematic cross sectional view of the prior art light emitting diode (LED) die taken along section line 1B-1B of FIG. 1A.

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Referring to FIGS. 3A-3H, a light emitting diode (LED) die 40 is illustrated. Although a square light emitting diode (LED) is described, it is to be understood that the concepts disclosed herein can be adapted to other types of (LED) dice or shapes such as rectangular or hexagonal (LED) dice. In addition, it is also be understood that the concepts disclosed herein can be adapted to other types of semiconductor devices where one needs to use a metal strap layer having better electrical conductivity than the semiconductor layer to deliver electron from one side of one polarity semiconductor layer to the farther side of the same polarity semiconductor layer before moving vertically through the opposite polarity semiconductor layer. In addition, for simplicity, various elements of the light emitting diode (LED) die 40 are not illustrated in all of the figures. As shown in the cross sections (FIGS. 3C-3H), the light emitting diode (LED) die 40 includes a substrate 42 and an epitaxial stack on the substrate 42 comprised of an n-type semiconductor layer 46, multiple quantum well (MQW) layer 48 in electrical contact with the n-type semiconductor layer 46 configured to emit electromagnetic radiation, and a p-type semiconductor layer 50 in electrical contact with the multiple quantum well (MQW) layer 48.

Figure 3A:
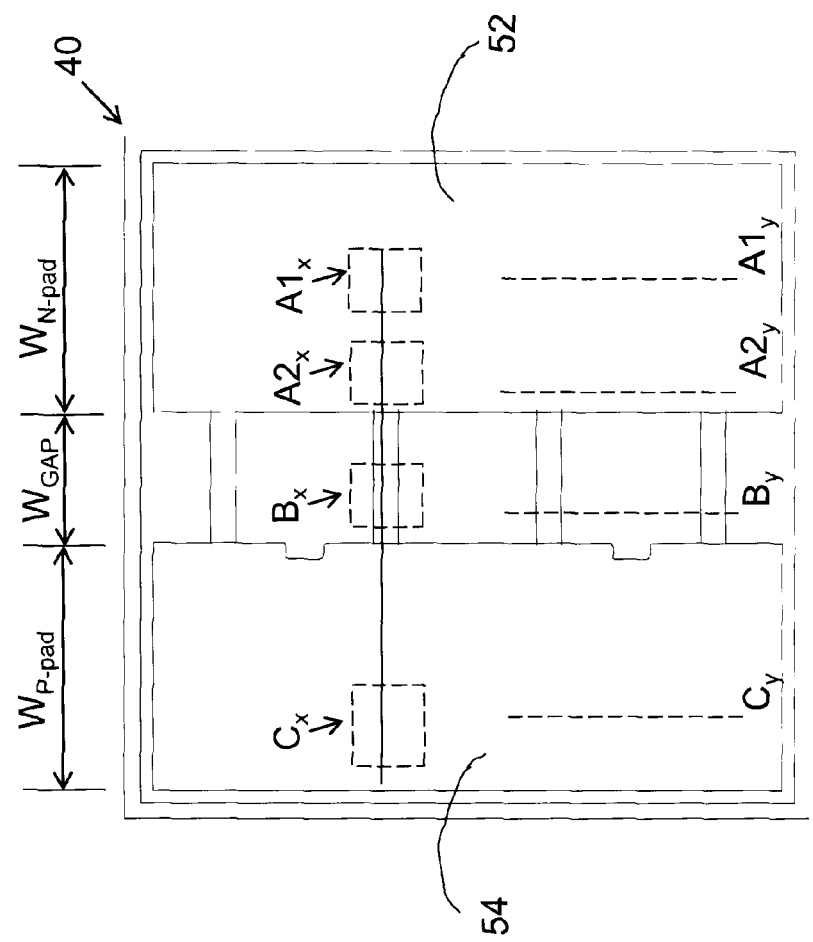
FIG. 3A is a schematic bottom view of a flip chip light emitting diode (LED) die having an n-strap layer.

As shown in FIG. 3A, the light emitting diode (LED) die 40 also includes an n-pad 52 in electrical contact with the n-type semiconductor layer 46, which forms a cathode (−), and a p-pad 54 in electrical contact with the p-type semiconductor layer 50, which forms an anode. The n-pad 52 and the p-pad 54 can comprise a conductive material, could be single or multiple layers comprising of metal or metal alloy containing W, Ti, Mo, Al, Cu, Ni, Ag, Cr, Pt, Sn, Au or Co, Cu—Co, Cu—Mo, TiW, AuSn or SnCu, or Ni/Cu or Ni/Cu—Mo.

The n-type semiconductor layer 46 can comprise n-GaN. Other suitable materials for the n-type semiconductor layer 46 include n-AlGaN, n-InGaN, n-AlInGaN, AlInN and n-AlN. The multiple quantum well (MQW) layer 48 includes one or more quantum wells comprising one or more layers of InGaN/GaN, AlGaInN, AlGaN, AlInN and AlN. The multiple quantum well (MQW) layer 48 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type semiconductor layer 50 can comprise p-GaN. Other suitable materials for the p-type semiconductor layer 50 include p-AlGaN, p-InGaN, p-AlInGaN, p-AlInN and p-AlN.

As shown in the cross sections (FIGS. 3C-3H), the light emitting diode (LED) die 40 also includes a mirror layer 56 on the p-type semiconductor layer 50 comprising a highly reflective metal layer configured to reflect the electromagnetic radiation emitted by the multiple quantum well (MQW) layer 48 outward from the (LED) die 40. By way of example, the mirror layer 56 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ni, Ag, Au, Cr, Pt, Pd, or Al.

As shown in the cross sections (FIGS. 3C-3H), the light emitting diode (LED) die 40 also includes an n-strap layer 60 in electrical contact with the n-pads 52 and with the n-type semiconductor layer 46, and an electrical insulator layer 64 configured to electrically insulate the n-strap layer 60. As shown in FIGS. 3B-1, 3B-2, 3B-3, the n-strap layer 60 includes a plurality of n-contact areas 44 formed in n-trenches 68 in the n-type semiconductor layer 46. The n-contact areas 44 spread out current and permit low resistance electrical paths with the n-type semiconductor layer 46.

The n-strap layer 60 can comprise a same metal as the n-pad 52 or a different metal than the n-pad 52, n-strap layer could be single or multi layers. Suitable metals include W, Ti, Mo, Al, Cu, Ni, Ag, Cr, Pt, Au or Co, or metal alloy containing W, Ti, Mo, Al, Cu, Ni, Ag, Cr, Pt, Au or Co such as Cu—Co, TiW, or Cu—Mo. The electrical insulator layer 64 can comprise an electrically insulating material, such as an oxide (e.g., $SiO_2$, $TiO_2$ $Al_2O_3$, $HfO_2$, $Ta_2O_5$), a polymer (e.g., epoxy, parylene, polyimide, photoresist, EPON Resin Su-8), a nitride (e.g. Silicon Nitride $Si_3N_4$ or Silicon Oxinitride SiNxOy, or a glass (e.g., SiO2, PSG, BPSG borophosphosilicate glass).

As shown in the cross sections (FIGS. 3C-3H), the light emitting diode (LED) die 40 also includes a p-contact layer 62 on the mirror layer 56 in electrical contact with the p-type semiconductor layer 50 and with the p-pad 54. The insulator layer 64 electrically insulates the p-contact layer 62 from the n-pads 52. The p-contact layer 62 can be formed of the same materials as previously described for the n-strap layer 60.

As shown in the cross sections (FIGS. 3C-3H, 4A), the n-trenches 68 are formed in the n-type semiconductor layer 46 with a selected depth Dt, a selected width $W_T$ and a selected geometrical shape; the n-trenches 68 are etched into the n-type semiconductor layer 46 to an optimum depth Dt to maximize the current conduction to achieve the lowest n-contact resistance resulting in low forward voltage and higher photon radiation output at operating current; this optimized Dt is achieved by experimentation where one would vary the trench depth into the n-type semiconductor layer 46 to achieve the desired value of n-contact resistance and/or current spreading to achieve optimum photon radiation output at desired operating current.

Figure 2:
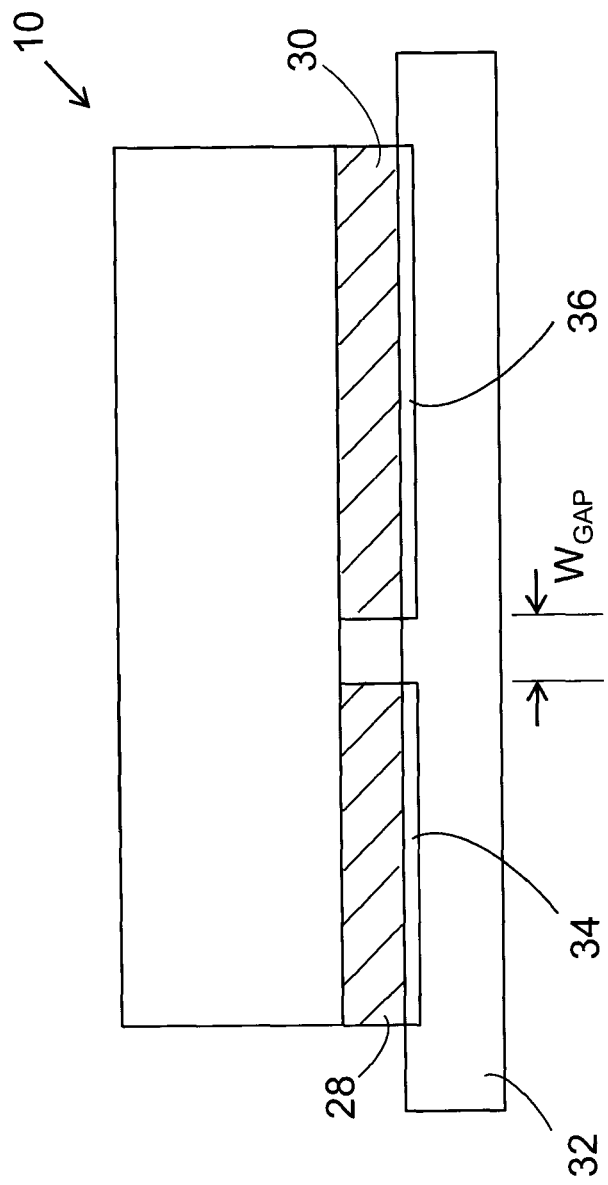
FIG. 2 is a schematic side elevation view of the prior art light emitting diode (LED) die flip chip mounted to a module substrate.
Figures 1, 3B:
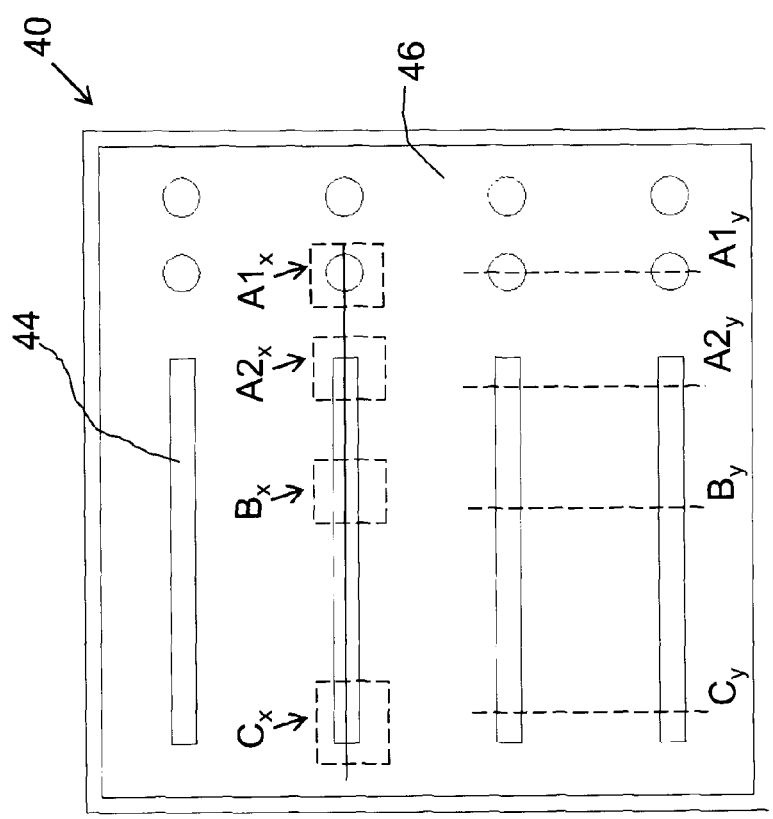
FIG. 3B-1 is a schematic transverse sectional view along an inner section that is planar to a surface of an n-conduct area of the flip chip light emitting diode (LED) die which has rectangular strap design.
Figures 2, 3B:
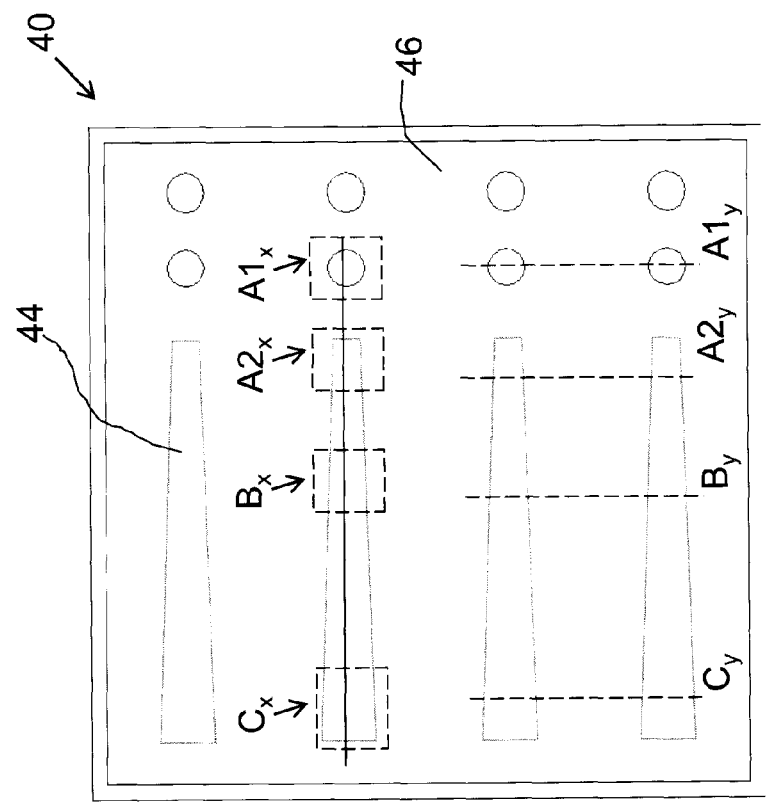
Figures 3, 3B:
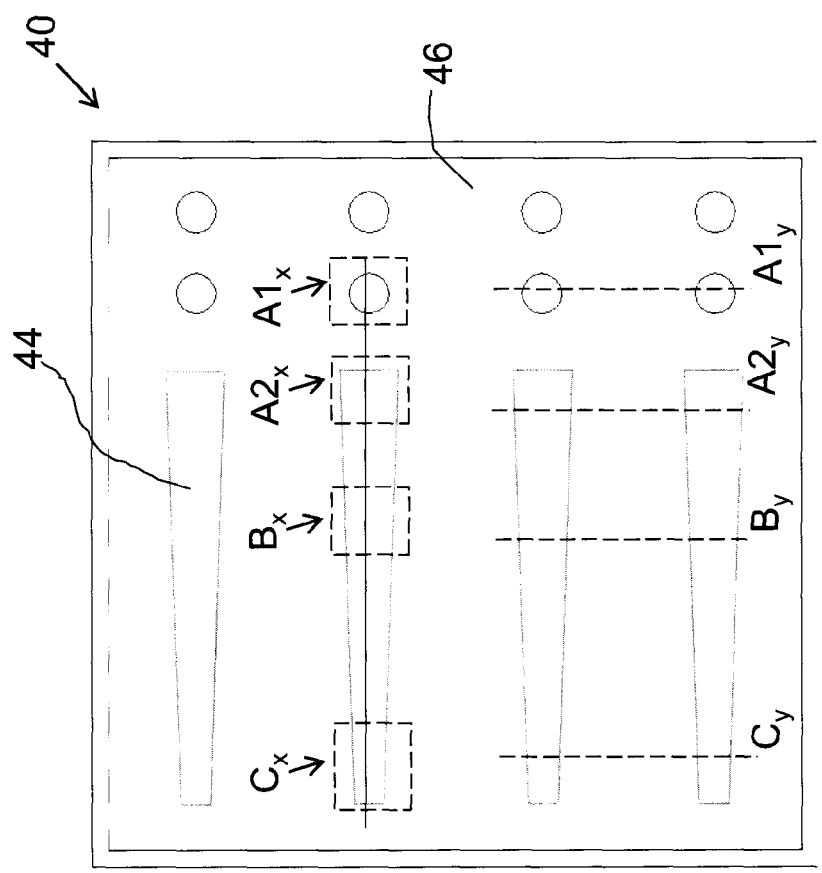
Figure 3G:
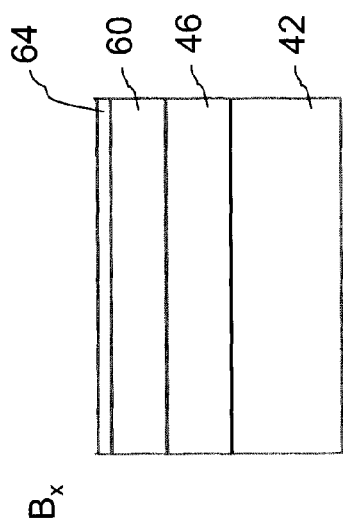
FIG. 3G is a schematic cross sectional view taken along section line Bx in FIGS. 3A and 3B-1, 3B-2, 3B-3 illustrating an x-direction cross section of the flip chip light emitting diode (LED) die.
Figure 3F:
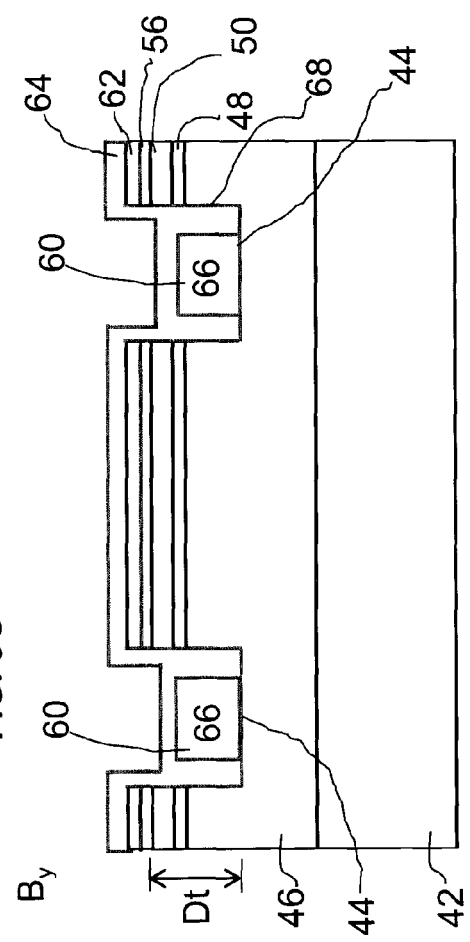
FIG. 3F is a schematic cross sectional view taken along section line By in FIGS. 3A and 3B-1, 3B-2, 3B-3 illustrating a y-direction cross section of the flip chip light emitting diode (LED) die.
Figure 3I:
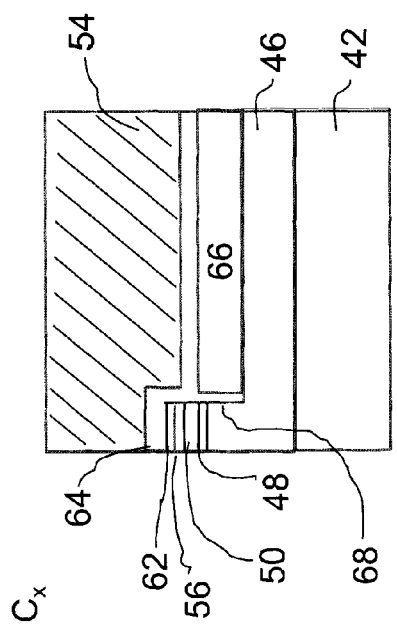
FIG. 3I is a schematic cross sectional view taken along section line Cx in FIGS. 3A and 3B-1, 3B-2, 3B-3 illustrating an x-direction cross section of the flip chip light emitting diode (LED) die.
Figure 3H:
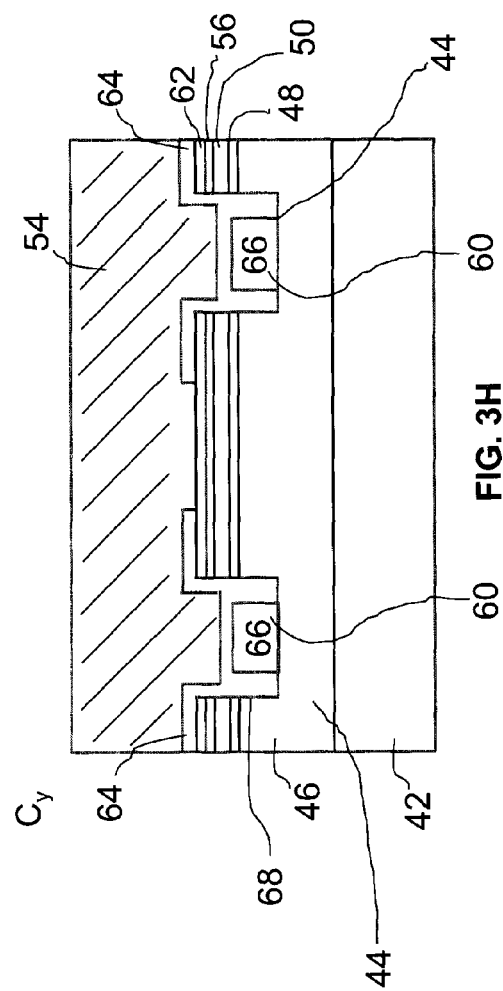
FIG. 3H is a schematic cross sectional view taken along section line Cy in FIGS. 3A and 3B-1, 3B-2, 3B-3 illustrating a y-direction cross section of the flip chip light emitting diode (LED) die.

The n-strap layer 60 includes the n-contact areas 44 (FIGS. 3B-1, 3B-2, 3B-3), which are formed along the bottom surface of the n-trenches 68 in electrical contact with the surface of the n-type semiconductor layer 46. The n-strap layer 60 forms a plurality of conductive straps 66 having a width that smaller than the width of the n-trenches 68. In addition, as shown in FIGS. 3B-2 and 3B-3, the n-strap layer 60 can form a plurality of conductive straps 66 with non-rectangular shapes such as trapezoid to further enhanced the current spreading. In addition, as shown in FIG. 3A, the conductive straps 66 can be formed with a length that is selected to span the width of the gap $W_G$ between the n-pad 52 and the p-pad 54. Further, the geometrical shape of the n-trenches 68 determines the geometrical shape of the n-contact areas 44 (FIG. 3B-1). As shown in FIG. 3B-1, at least some of the n-trenches 68 can comprise elongated, could be rectangular shaped trenches or non-rectangular shaped trenches, which are oriented such that a portion of n-trenches 68 would go under the p-pad 54 where the p-pad 54 is above a portion of the n-strap 60 but would be isolated from the conductive straps 66; at least some of the elongated n-trenches 68 are oriented such that a portion of n-trenches 68 would go under the n-pad 52 where the n-pad 52 is above a portion of the n-strap 60 but would be making contact to a portion of the conductive straps 66 underneath the n-pad. As also shown in FIG. 3B-1, at least some of the n-trenches 68 can comprise more than one shape such as rectangular with circular members, rectangular with circular and ellipse members, short and long rectangular members, rectangular and square members, elongated and non-elongated members or combination of different shapes. Again the size, number and shape of the n-trenches 68 are intended to be exemplary and not limiting in scope Again the geometrical shape of the elongated n-trenches 68 also can be non rectangular shaped trenches, like small n-end with big p-end or big n-end with small p-end (FIGS. 3B-2 and FIG. 3B-3).

Figure 5:
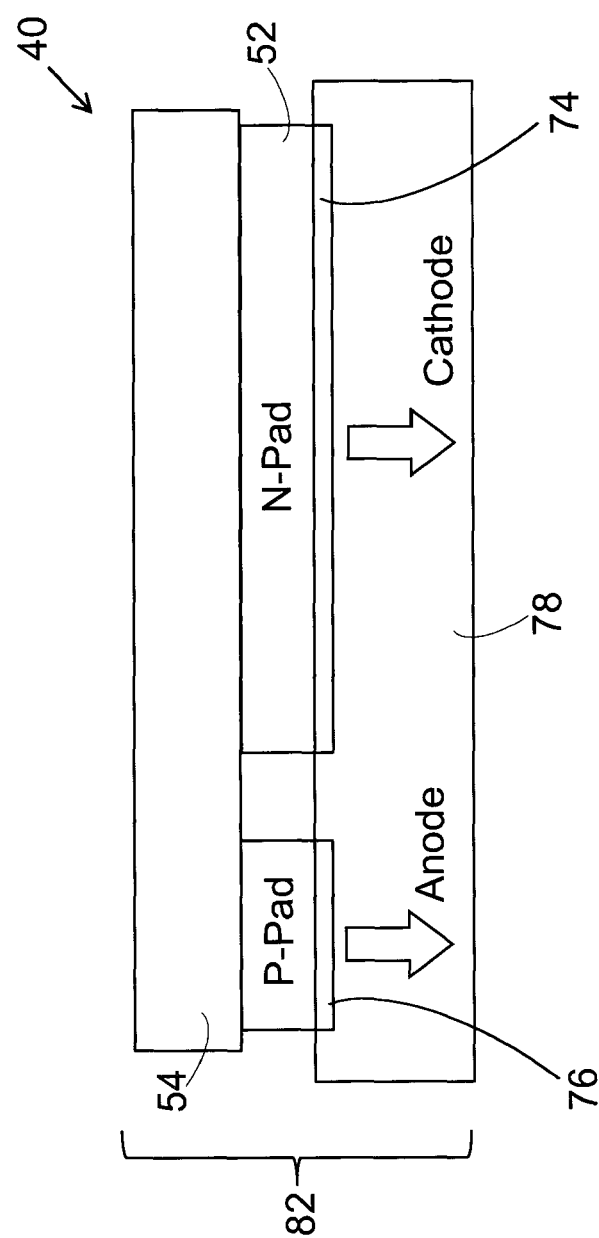
FIG. 5 is a schematic side elevation view of the flip chip light emitting diode (LED) die mounted to a module substrate.

The n-strap layer 60 performs several functions in the light emitting diode (LED) die 40. A first function of the n-strap layer 60 is to increase the n-contact areas 44 (FIGS. 3B-1, 3B-2, 3B-3) with the n-type semiconductor layer 46. This improves current flow in the light emitting diode (LED) die 40 and increases the radiation output. The n-strap layer 60 also forms the conductive straps 66 having n-ends that electrically contacts the n-pad 52, and having p-ends that extend under the p-pad 54 but isolated from the p-pad 54. The n-strap layer 60 enhances the current spreading by delivering the electron to the outer edge of the n-type semiconductor layer under the p-pad 54 due to better electrical conductivity of the metal strap layer 66 as comparing to the n-type semiconductor layer 46, resulting in higher the radiation output along the outer edge of the p-pad 54 due to the resistance path that the electron would travel between the outer edge of the p-pad 54 and the n-strap layer 60 can be less than it would be without the n-strap layer 60. The n-strap layer 60 also allows the width $W_P$ (FIG. 3A) of the p-pad 54, the width $W_N$ (FIG. 3A) of the n-pad 52, and the gap width $W_G$ (FIG. 3A) between the n-pad 52 and the p-pad 54 to be adjustable, without requiring different masks during the fabrication process. In addition, this width adjustability increases the process window during a subsequent packaging process for the light emitting diode (LED) die 40, as the size and spacing of the n-pad 52 and the p-pad 54 can be matched to the size and spacing of an n-electrode 74 (FIG. 5) and a p-electrode 76 (FIG. 5) on a module substrate 78 (FIG. 5).

Figure 4A:
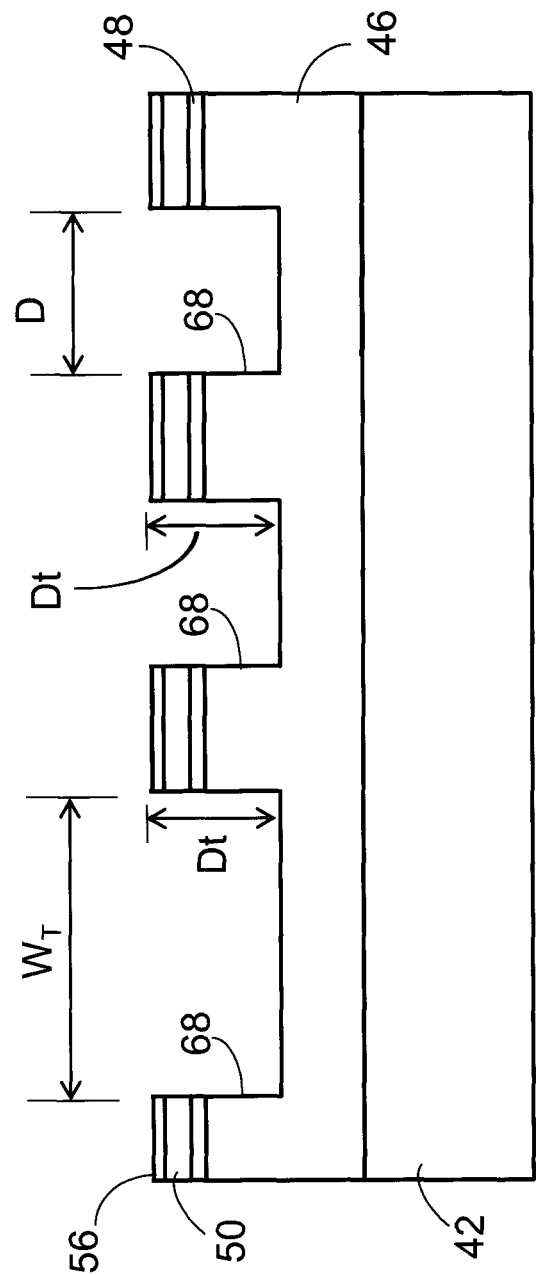
FIGS. 4A-4D are schematic cross sectional views illustrating steps in a method for fabricating the flip chip light emitting diode (LED) die of FIGS. 3A-3I.

Referring to FIGS. 4A-4D, steps in a method for fabricating the light emitting diode (LED) die 40 are illustrated. Initially, as shown in FIG. 4A, the substrate 42 can be provided. For a wafer level fabrication process, the substrate 42 can be in the form of a wafer that can later be separated into multiple light emitting diode (LED) dice 40. The substrate 42 can comprise a suitable material, such as sapphire, silicon carbide (SiC), silicon, germanium, zinc oxide (ZnO), or gallium arsenide (GaAs).

As also shown in FIG. 4A, an epitaxial stack comprised of the n-type semiconductor layer 46, the multiple quantum well (MQW) layer 48 and the p-type semiconductor layer 50 can be formed on the substrate 42 using a suitable deposition process such as vapor phase epitaxy (VPE), molecular beam epitaxy (MBE) or liquid phase epitaxy (LPE). In the illustrative embodiment, the n-type semiconductor layer 46 comprises n-GaN and the p-type semiconductor layer 50 comprises p-GaN. Rather than GaN, the n-type semiconductor layer 46, and the p-type semiconductor layer 50 can comprise various other compound semiconductor materials, such as AlGaN, InGaN, and AlInGaN.

As also shown in FIG. 4A, the mirror layer 56 can be formed on the p-type semiconductor layer 50 and a thin protective layer (not shown), such as a layer of $SiO_2$ can be formed on the mirror layer 56. By way of example, the mirror layer 56 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al. A thickness of the mirror layer 56 can be less than about 1.0 μm. High temperature annealing or alloying of the mirror layer 56 can be used to improve the contact resistance and adhesion of the mirror layer 56 to the p-type semiconductor layer 50. For example, the annealing or alloying process can be conducted at a temperature of at least 150° C. in an inert environment (e.g., an atmosphere containing little or no oxygen, hydrogen, or neither oxygen nor hydrogen).

As also shown in FIG. 4A, a suitable process can be used to form the n-trenches 68 in the epitaxial stack that can extend a selected distance into the n-type semiconductor layer 46. In addition, the n-trenches can comprise elongated rectangular elements corresponding to the rectangular n-contact areas 44 in FIGS. 3B-1, 3B-2, 3B-3 or circular elements corresponding to the circular n-contact areas in FIGS. 3B-1, 3B-2, 3B-3. For elongated rectangular trenches, a width $W_T$ of the n-trenches 68 can be in a range of from about 0.1 µm to about 300 µm. For circular trenches, a diameter D of the n-trenches can also be in a range of from about 0.1 µm to about 300 µm. One suitable process for forming the n-trenches 68 comprises dry etching through a hard mask. After the trench forming process, a liquid or a solvent can be used to remove the etch mask, or other protective coating. As another option, p-trenches (not shown) could also be formed in the p-type semiconductor layer 50.

Figure 4B:
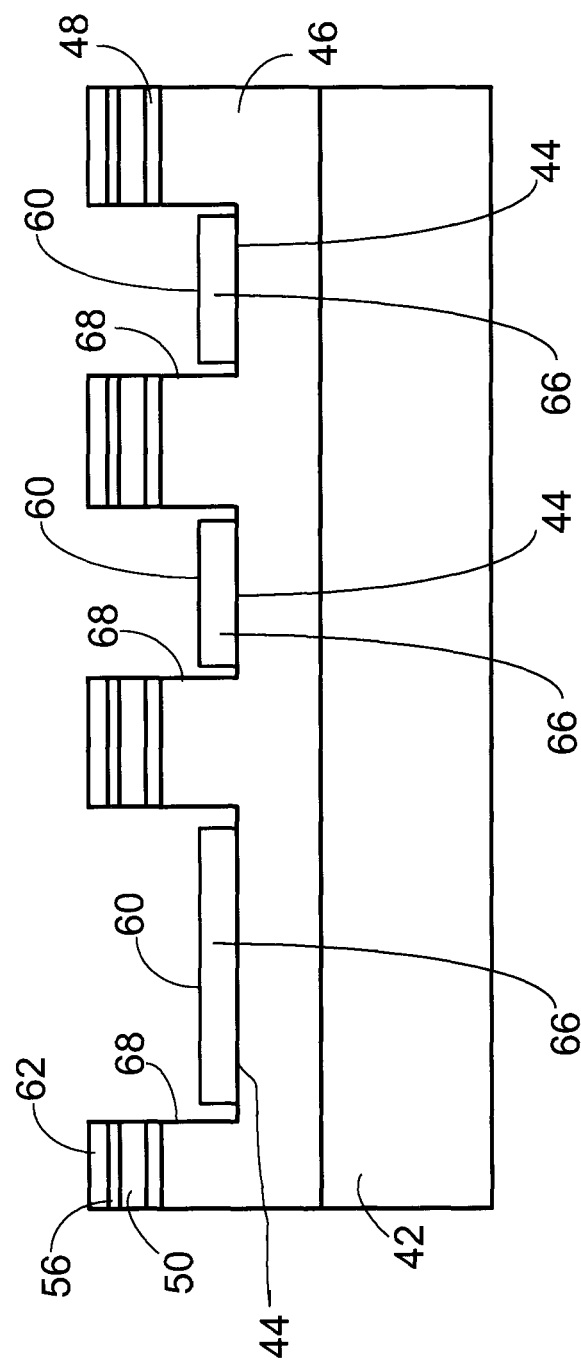
Figure 4C:
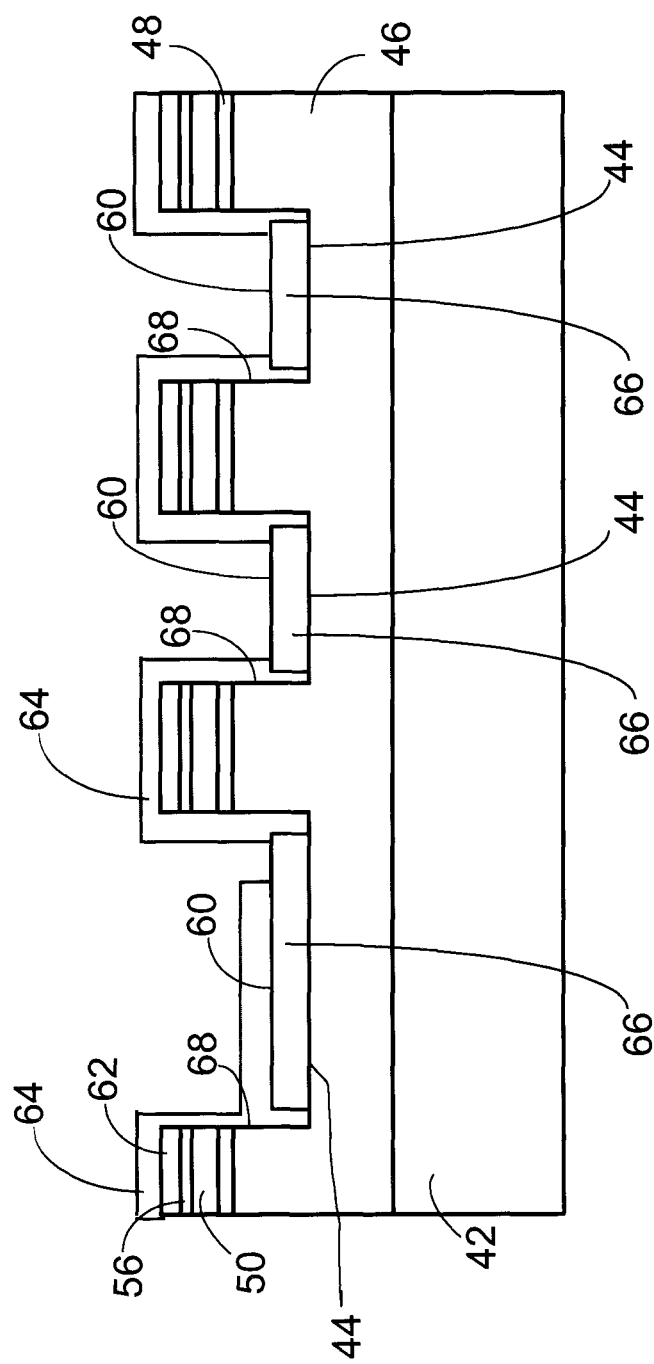

Next, as shown in FIG. 4B, the n-strap layer 60 can be formed in the n-trenches 68 on the surface of the n-type semiconductor layer 46. As also shown in FIG. 4C, the p-contact layer 62 can be formed on the p-type semiconductor layer 50 using the same deposition process as for the n-strap layer 60, or using a separate deposition process. The n-strap layer 60 and the p-contact layer 62 can each comprise a metal layer, a metal alloy or a metal stack as previously described. The n-strap layer 60 and the p-contact layer 62 can each be formed using a suitable deposition process, such as an electro-deposition process or an electroless deposition process, to a desired thickness (e.g., 1 µm to 500 µm) and with the previously described sizes and shapes. Other suitable deposition processes for forming the n-strap layer 60 and the p-contact layer 62 can include chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

Next, as also shown in FIG. 4C, the electrical insulator layer 64 can be formed using a suitable deposition or growth process. As previously described, the electrical insulator layer 64 can comprise an electrically insulating material, such as an oxide (e.g., $SiO_2$, $TiO_2$ $Al_2O_3$, $HfO_2$, $Ta_2O_5$), a polymer (e.g., epoxy, parylene, polyimide, photoresist, EPON Resin Su-8), a nitride (e.g. $Si_3N_4$), or a glass (e.g., BPSG borophosilicate glass).

Figure 4D:
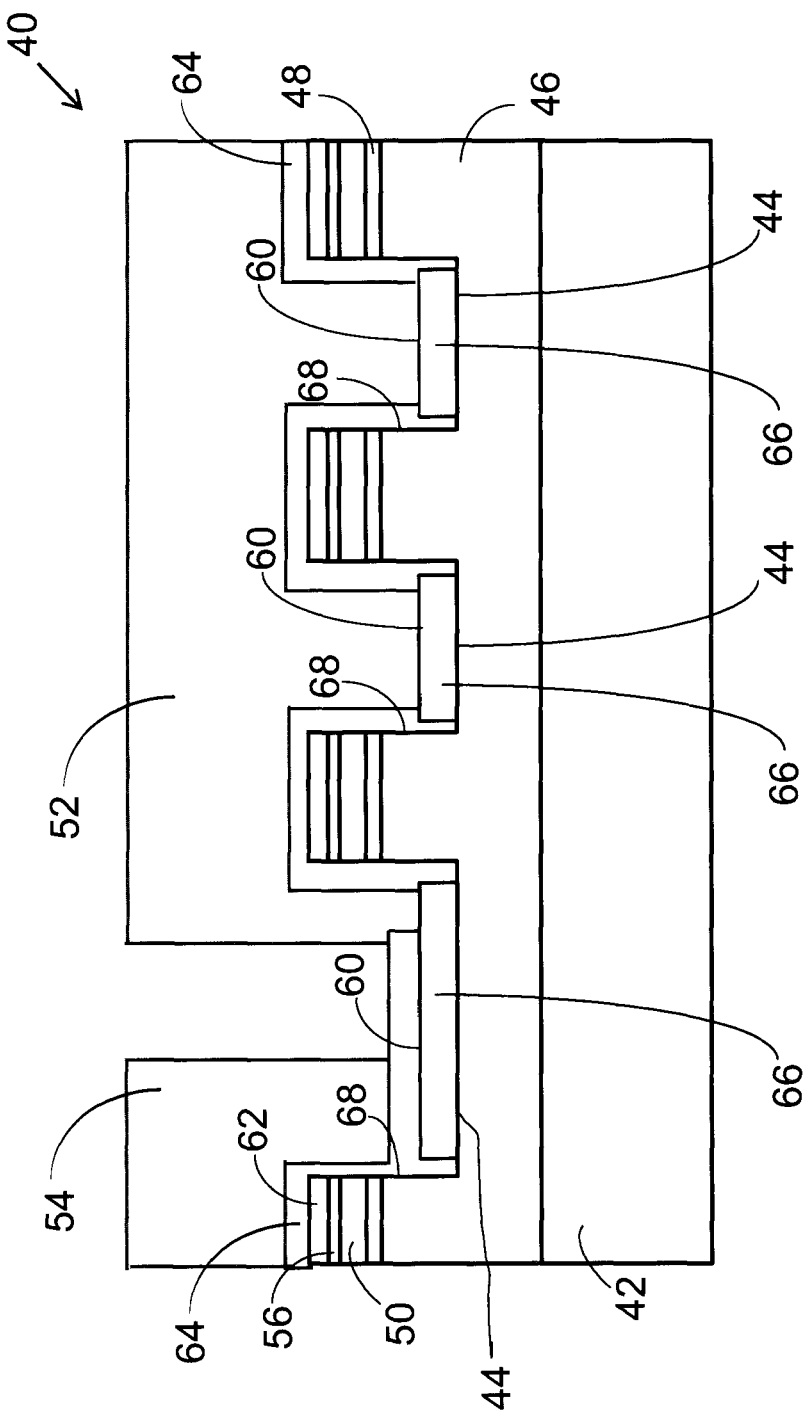

Next, as shown in FIG. 4D, the p-pad 54 and the n-pad 52 can be formed on the electrical insulator layer 64. The p-pad 54 and the n-pad 52 can comprise a metal layer, a metal alloy or a metal stack formed using a suitable process such as etching an initially deposited layer (e.g., subtractive process), or alternately patterned deposition through a mask (e.g., additive process). For example, a deposition process, such as an electro-deposition process or an electroless deposition process can be used to deposit metal layer to a desired thickness (e.g., 1 µm to 500 µm). Other suitable deposition processes include chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

Following these process steps, a separating process can be performed using a suitable process such as laser dicing, sawing, breaking, air knifing or water jetting to singulate the individual light emitting diode (LED) die 40. For simplicity, these steps are not shown. By way of example, the light emitting diode (LED) die 40 can have a square peripheral shape having a size range of at least 100 µm on a side (S). However, this shape and size range is by way of example and other polygonal, circular and oval shapes and size ranges can be employed. A representative size range for the width $W_P$ of the p-pad 54 can be from at least 20 µm. A representative size range for the gap width $W_G$ can be from at least 20 µm. A representative size range for the width $W_T$ of the n-trenches 68 can be from at least 10 µm and the length of the n-trenches 68 can be from at least 10 µm. Again, all of these size ranges are intended to be exemplary and not limiting in scope.

The fabrication method with the n-strap layer 60 permits the size of the gap $W_G$, as well as the width $W_P$ of the p-pad 54 and the width $W_N$ of the n-pad 52 to be adjusted to provide optimal radiation output and a large process window for packaging. In addition, the light emitting diode (LED) die 40 and fabrication method provide at least several advantages. First, the electrical flow distance between the p-pad 54 and n-pad 52 shrinks due to the n-strap layer 60. This improves the output radiation, while decreasing or maintaining fabrication costs, regardless of the values for the gap width $W_G$, the width $W_P$ of the p-pad 54, and the width $W_N$ of the n-pad 52. Additionally, the fabrication method accommodates different sizes for the gap width $W_G$, the width $W_P$ of the p-pad 54, and the width $W_N$ of the n-pad 52. This provides design flexibility without increasing manufacturing costs. Second, the n-strap layer 60 provides additional flexibility for designing the sizes of the p-pad 54, the n-pad 52, and the gap width $W_G$, which facilitates the packaging process. Third, additional masks and additional process steps are not required, which not only improves yield, but also decreases the cost of manufacturing, and saves the time of manufacturing as well.

As shown in FIG. 5, the light emitting diode (LED) die 40 can be flip chip mounted to a module substrate 78 to form a package system 82. During a flip chip bonding process, the p-pad 54 can be bonded to the p-electrode 76 on the module substrate 78 to provide an anode, and the n-pad 52 can be bonded to the n-electrode 74 on the module substrate 78 to provide a cathode. Suitable bonding processes include soldering, eutectic, reflow or conductive adhesive bonding.

Thus the disclosure describes an improved flip chip light emitting diode (LED) die and a method for fabricating the (LED) die. While the description has been with reference to certain preferred embodiments, as will be apparent to those skilled in the art, certain changes and modifications can be made without departing from the scope of the following claims.

What is claimed is:

1. A method for fabricating a light emitting diode (LED) die comprising:
   forming an epitaxial stack on a substrate having a first-type semiconductor layer comprising a p-type semiconductor layer, a multiple quantum well (MQW) layer, and a second-type semiconductor layer comprising an n-type semiconductor layer;
   forming a plurality of trenches in the second-type semiconductor layer;

forming an n-strap layer on the epitaxial stack comprising a plurality of conductive straps and contact areas in the trenches, with the contact areas in electrical contact with the second-type semiconductor layer and with the contact areas configured to provide a total contact area;

forming an electrical insulator layer on the n-strap layer;

forming a first pad on the first-type semiconductor layer;

forming a second pad on the second-type semiconductor layer, with the first pad and the second pad separated by a gap; and adjusting a size of the gap by selection of a length of the conductive straps.

2. The method of claim 1 wherein the trenches comprise elongated rectangular trenches or circular trenches formed in the second-type semiconductor layer to a selected depth.

3. A method for fabricating a light emitting diode (LED) die comprising:

forming an epitaxial stack comprising a p-type semiconductor layer, a multiple quantum well (MQW) layer in electrical contact with the p-type semiconductor layer configured to emit electromagnetic radiation, and an n-type semiconductor layer in electrical contact with the multiple quantum well (MQW) layer having a trench;

forming a p-pad in electrical communication with the p-type semiconductor layer;

forming an n-pad in electrical contact with the n-type semiconductor layer, with the p-pad and the n-pad separated by a gap;

forming an n-strap layer comprising a conductive material in the trench in electrical contact with the n-pad and with the n-type semiconductor layer, the strap layer configured to conduct current from the n-pad through the trench and across the n-type semiconductor layer in an area under the p-pad, with the area having a selected size and shape;

forming an electrical insulator layer on the strap layer configured to electrically insulate the conductive material from the p-pad; and adjusting a size of the gap by selection of a length of the conductive straps.

4. The method of claim 3 wherein the trench comprises an elongated rectangular shaped trench formed in the n-type semiconductor layer to a selected depth.

5. The method of claim 3 wherein the trench has a shape selected from the group consisting of rectangular, circular, square, elliptical, trapezoidal and a combination of these shapes.

6. The method of claim 3 further comprising forming a mirror layer on the p-type semiconductor layer configured to reflect the electromagnetic radiation emitted by the multiple quantum well (MQW) layer outward from the (LED) die.

7. A method for fabricating a light emitting diode (LED) die comprising:

providing a substrate;

forming an epitaxial stack on the substrate comprising a p-type semiconductor layer, a multiple quantum well (MQW) layer in electrical contact with the p-type semiconductor layer configured to emit electromagnetic radiation, and an n-type semiconductor layer in electrical contact with the multiple quantum well (MQW) layer having a plurality of trenches;

forming a p-pad in electrical contact with the p-type semiconductor layer;

forming an n-pad in electrical contact with the n-type semiconductor layer, with the p-pad and the n-pad separated by a gap;

forming an n-strap layer in electrical contact with the n-pad and with the n-type semiconductor layer, the n-strap layer comprising a plurality of conductive straps in the trenches having a plurality of n-ends and n-contact areas in the trenches configured to spread current across the n-type semiconductor layer and a plurality of p-ends extending subjacent to the p-pad configured to electrically contact the p-pad;

forming an electrical insulator layer on the n-strap layer configured to electrically insulate the p-ends of the conductive straps from the p-pad; and adjusting a size of the gap by selection of a length of the conductive straps.

8. The method of claim 7 wherein the conductive straps have a shape selected to spread the current.

9. The method of claim 7 further comprising providing a module substrate having a p-electrode and an n-electrode, and bonding the p-pad to the p-electrode and the n-pad to the n-electrode.

10. The method of claim 7 wherein at least some of the trenches comprise elongated rectangular shaped trenches formed in the n-type semiconductor layer to a selected depth.

11. The method of claim 7 wherein the trenches have shapes selected from the group consisting of rectangular, circular, square, elliptical, trapezoidal and a combination of these shapes.

* * * * *